(12) United States Patent
Yokota et al.

(10) Patent No.: US 11,041,241 B2
(45) Date of Patent: Jun. 22, 2021

(54) PLASMA PROCESSING APPARATUS AND TEMPERATURE CONTROL METHOD

(71) Applicant: Tokyo Electron Limited, Tokyo (JP)

(72) Inventors: Akihiro Yokota, Miyagi (JP); Kazuki Moyama, Miyagi (JP); Koji Maruyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 201 days.

(21) Appl. No.: 16/432,207

(22) Filed: Jun. 5, 2019

(65) Prior Publication Data

US 2019/0376185 A1    Dec. 12, 2019

(30) Foreign Application Priority Data

Jun. 8, 2018   (JP) .............................. JP2018-109941

(51) Int. Cl.
*C23C 16/455* (2006.01)
*H01J 37/32* (2006.01)
*H01L 21/67* (2006.01)

(52) U.S. Cl.
CPC .. *C23C 16/45565* (2013.01); *C23C 16/45572* (2013.01); *H01J 37/32091* (2013.01); *H01J 37/32449* (2013.01); *H01J 37/32522* (2013.01); *H01L 21/67069* (2013.01); *H01L 21/67248* (2013.01); *H01J 2237/002* (2013.01)

(58) Field of Classification Search
CPC ......... C23C 16/45565; C23C 16/45572; H01J 37/32091; H01J 37/32449; H01J 37/32522; H01J 2237/002; H01L 21/67069; H01L 21/67248; H01L 21/67109
See application file for complete search history.

(56) References Cited

U.S. PATENT DOCUMENTS

| 7,208,067 | B2 * | 4/2007 | Mitrovic | ........... H01L 21/67248 |
| | | | | 156/345.27 |
| 2004/0188021 | A1 * | 9/2004 | Mitrovic | ............. H01L 21/6833 |
| | | | | 156/345.52 |

(Continued)

FOREIGN PATENT DOCUMENTS

JP    2015-216261 A    12/2015

*Primary Examiner* — Jeffrie R Lund
(74) *Attorney, Agent, or Firm* — Abelman, Frayne & Schwab

(57) ABSTRACT

A plasma processing apparatus includes: a shower head including a ceiling plate having a plurality of gas holes, and a base member having a space so as to supply the processing gas to the plurality of gas holes; a temperature adjustment mechanism provided in the shower head; an acquisition unit configured to acquire a combination of a plasma parameter and pressure in the space in the base member; an estimation unit configured to estimate temperature of the ceiling plate corresponding to the acquired combination of the parameter and the pressure with reference to temperature information indicating the temperature of the ceiling plate corresponding to the combination of the parameter and the pressure; and a temperature controller configured to control the temperature adjustment mechanism such that the estimated temperature of the ceiling plate becomes target temperature when a plasma processing is performed.

5 Claims, 7 Drawing Sheets

(56) References Cited

U.S. PATENT DOCUMENTS

| | | | | |
|---|---|---|---|---|
| 2019/0148120 A1* | 5/2019 | Oka | .................. | H01L 21/67109 |
| | | | | 219/468.1 |
| 2019/0371570 A1* | 12/2019 | Oka | ........................ | C23C 16/52 |
| 2019/0376185 A1* | 12/2019 | Yokota | .............. | H01J 37/32091 |
| 2021/0043431 A1* | 2/2021 | Bin Budiman | ... | H01L 21/67103 |

* cited by examiner

|  | | TEMPERATURE OF COOLANT (°C) | | | | |
|---|---|---|---|---|---|---|
|  | | 10 | 20 | 30 | 40 | 50 |
| FLOW RATE OF COOLANT (l/min) | 10 | | | | | |
|  | 15 | | | | | |
|  | 20 | 40 (°C) | | 60 (°C) | | |
|  | 25 | | | | | |
|  | 30 | | | 40 (°C) | | |

TEMPERATURE OF CEILING PLATE

|  |  | PRESSURE OF CENTRAL SPACE (Torr) | | | | |
|---|---|---|---|---|---|---|
|  |  | 0 | 1 | 2 | 5 | 10 |
| VALUE OF RF POWER (W) | 100 |  |  |  |  |  |
|  | 500 |  | 30 (°C) |  |  |  |
|  | 1000 |  |  |  |  |  |
|  | 2000 |  |  | 60 (°C) |  |  |
|  | 5000 |  |  |  | 80 (°C) |  |
|  | 10000 |  |  |  |  |  |

TEMPERATURE OF CENTRAL PORTION OF CEILING PLATE

FIG. 9

| | | PRESSURE OF EDGE SPACE (Torr) | | | | |
|---|---|---|---|---|---|---|
| | | 0 | 1 | 2 | 5 | 10 |
| VALUE OF RF POWER (W) | 100 | | | | | |
| | 500 | | 30 (°C) | | | |
| | 1000 | | | 35 (°C) | | |
| | 2000 | | | | | 40 (°C) |
| | 5000 | | | | | |
| | 10000 | | | | | |

TEMPERATURE OF EDGE PORTION OF CEILING PLATE

FIG. 10

| | | TEMPERATURE OF CENTRAL COOLANT (°C) | | | | |
|---|---|---|---|---|---|---|
| | | 10 | 20 | 30 | 40 | 50 |
| FLOW RATE OF CENTRAL COOLANT (l/min) | 10 | | | | | |
| | 15 | | | | | |
| | 20 | 40 (°C) | | 60 (°C) | | |
| | 25 | | | | | |
| | 30 | | | 40 (°C) | | |

TEMPERATURE OF CENTRAL PORTION OF CEILING PLATE

PLASMA PROCESSING APPARATUS AND TEMPERATURE CONTROL METHOD

CROSS-REFERENCE TO RELATED APPLICATIONS

This application is based on and claims priority from Japanese Patent Application No. 2018-109941, filed on Jun. 8, 2018 with the Japan Patent Office, the disclosure of which is incorporated herein in its entirety by reference.

TECHNICAL FIELD

The present disclosure relates to a plasma processing apparatus and a temperature control method.

BACKGROUND

In the related art, there has been known a plasma processing apparatus that supplies a processing gas to a substrate disposed in a processing container to perform a plasma processing such as an etching processing. The plasma processing apparatus performs a plasma processing by ejecting a processing gas from a shower head disposed to face a substrate and applying a radio frequency (RF) power to generate plasma of the processing gas. The shower head has, for example, a ceiling plate disposed to face a substrate and having a plurality of gas holes formed therein for ejecting the processing gas, and a base member supporting the ceiling plate and having a gas diffusion space formed therein.

In such a plasma processing apparatus, in order to perform a plasma processing uniformly on a substrate, it is required to adjust the deposition amount of the deposit deposited on the ceiling plate of the shower head. For this reason, there has been known a technology for keeping the temperature of the ceiling plate of the shower head constant so as to adjust the deposition amount of the deposit. For example, Japanese Patent Laid-Open Publication No. 2015-216261 proposes a structure in which a coolant flow path is provided in a base member of a shower head to control the temperature of the ceiling plate.

SUMMARY

A plasma processing apparatus according to an aspect of the present disclosure includes: a shower head disposed to face a stage on which a substrate is placed, and including a ceiling plate having a plurality of gas holes formed therein so as to eject a processing gas into a processing container, and a base configured to support the ceiling plate, the base including a space formed therein so as to supply the processing gas to the plurality of gas holes; a temperature adjustment mechanism including a coolant flow path provided in the shower head; and a controller configured to: acquire a combination of a parameter related to generation of plasma of the processing gas ejected from the shower head toward the substrate and pressure in the space in the base; estimate temperature of the ceiling plate corresponding to the acquired combination of the parameter and the pressure in the space in the base with reference to temperature information indicating the temperature of the ceiling plate corresponding to the combination of the parameter and the pressure in the space in the base; and control the temperature adjustment mechanism such that the estimated temperature of the ceiling plate becomes a target temperature when a plasma processing is performed on the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 9 is a diagram illustrating an exemplary relationship of the temperature of a ceiling plate with respect to a combination of values of RF power and the pressure of an edge space in the base member.

FIG. 10 is a diagram for explaining an exemplary method of controlling the temperature of a ceiling plate according to the second embodiment.

DETAILED DESCRIPTION

Figure 1:
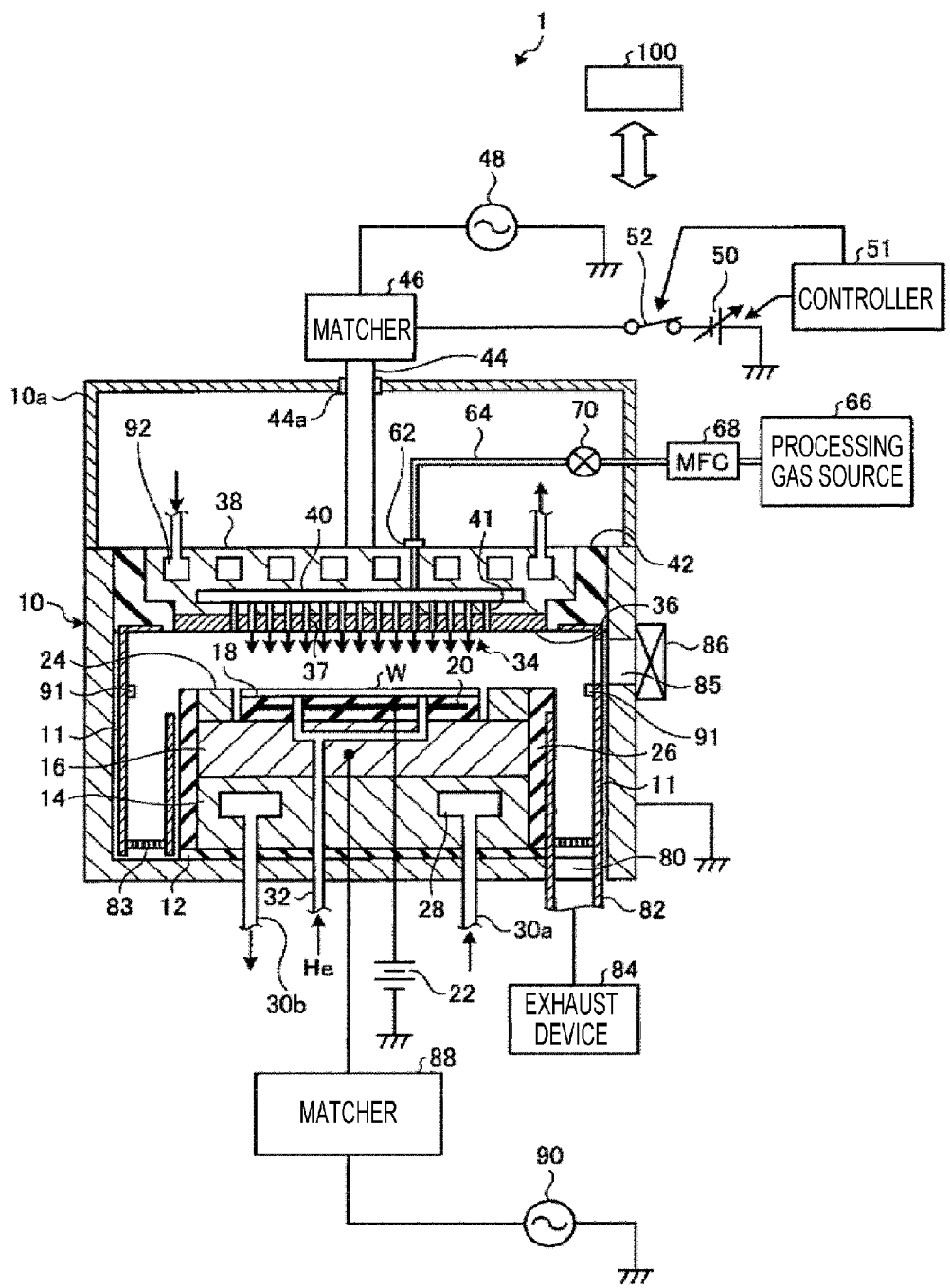
FIG. 1 is a schematic cross-sectional view illustrating a plasma processing apparatus according to a first embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, various embodiments will be described in detail with reference to the accompanying drawings. In each drawing, the same or corresponding components will be denoted by the same symbols.

In the related art, there has been known a plasma processing apparatus that supplies a processing gas to a substrate disposed in a processing container to perform a plasma processing such as, for example, an etching processing. The plasma processing apparatus performs a plasma processing by ejecting a processing gas from a shower head disposed to face a substrate and applying RF power to generate plasma of the processing gas. The shower head has, for example, a ceiling plate disposed to face, for example, a substrate and having a plurality of gas holes formed therein for ejecting the processing gas, and a base member supporting the ceiling plate and having a gas diffusion space formed therein.

In such a plasma processing apparatus, in order to perform a plasma processing uniformly on a substrate, it is required to control the deposition amount of deposit deposited on the ceiling plate of the shower head. For this reason, there has been known a technique for keeping the temperature of the ceiling plate of the shower head constant so as to adjust the deposition amount of the deposit. For example, Japanese Patent Laid-Open Publication No. 2015-216261 proposes a structure in which a coolant flow path is provided in a base member of a shower head to control the temperature of the ceiling plate.

The amount of heat removed from the ceiling plate to the coolant flow path provided in the base member varies being affected by the pressure in the gas diffusion space existing between the base member and the ceiling plate, and the amount of heat input from the plasma to the ceiling plate. The pressure in the gas diffusion space depends on the flow rate of the processing gas used for a plasma processing such that the pressure in the gas diffusion space increases as the flow rate increases. However, it is necessary to use an appropriate flow rate due to the characteristics of the plasma processing. The amount of heat input from the plasma to the ceiling plate depends on parameters relating to the generation of the plasma such as, for example, RF power. However, due to the characteristics of the plasma, it is required to use proper RF power. For this reason, in the structure described in Japanese Patent Laid-Open Publication No. 2015-216261, when performing a plasma processing on a substrate, the flow rate of the processing gas and the parameters related to plasma generation may differ depending on required process characteristics, and the temperature of the ceiling plate may change from a target temperature. As a result, in the structure described in Japanese Patent Laid-Open Publication No. 2015-216261, it becomes difficult to control the temperature of the ceiling plate with high accuracy.

First Embodiment

FIG. 1 is a schematic cross-sectional view illustrating a plasma processing apparatus 1 according to a first embodiment. The plasma processing apparatus 1 performs a predetermined plasma processing on a substrate. The plasma processing apparatus 1 has a substantially cylindrical chamber (a processing container) 10 made of, for example, aluminum having an anodized surface. The processing container 10 is securely grounded.

A cylindrical susceptor support 14 is disposed on the bottom of the processing container 10 via an insulating plate 12 made of, for example, ceramics, and a susceptor (stage) 16 made of, for example, aluminum is provided on the susceptor support 14. The susceptor 16 constitutes a lower electrode, and a semiconductor wafer (hereinafter referred to as a "wafer") W, which is a substrate to be processed, is placed thereon.

An electrostatic chuck 18 configured to attract and hold the wafer W by electrostatic force is provided on the upper surface of the susceptor 16. The electrostatic chuck 18 has a structure in which an electrode 20 made of a conductive film is sandwiched between a pair of insulating layers or insulating sheets, and a DC power supply 22 is electrically connected to the electrode 20. Then, the wafer W is attracted to and held on the electrostatic chuck 18 by an electrostatic force such as, for example, a Coulomb force generated by the DC voltage from the DC power supply 22.

A conductive focus ring (a correction ring) 24 made of, for example, silicon is disposed on the upper surface of the susceptor 16 around the electrostatic chuck 18 (the wafer W) in order to improve etching uniformity. On the side surfaces of the susceptor 16 and the susceptor support 14, a cylindrical inner wall member 26 made of, for example, quartz is provided.

Inside the susceptor support 14, for example, a coolant flow path 28 is provided on the circumference of the susceptor support 14. The coolant flow path 28 is connected to a chiller unit provided outside the processing container 10 through the pipes 30a and 30b, and a coolant having predetermined temperature (e.g., brine) is circulated and supplied. The plasma processing apparatus 1 is configured to be able to control the temperature of the susceptor 16 by controlling the temperature or flow rate of the coolant supplied from the chiller unit to the coolant flow path 28.

In addition, a heat transfer gas from a heat transfer gas supply mechanism (not illustrated) (e.g., He gas) is supplied between the upper surface of the electrostatic chuck 18 and the rear surface of the wafer W through the gas supply line 32.

A shower head 34 having a function as an upper electrode is provided above the susceptor 16 serving as a lower electrode so as to face the susceptor 16 in parallel. The shower head 34 and the susceptor 16 function as a pair of electrodes (an upper electrode and a lower electrode). The space between the shower head 34 and the susceptor 16 becomes a plasma generation space.

In addition, the shower head 34 is supported in the upper portion of the processing container 10 via an insulative blocking member 42. The shower head 34 includes a ceiling plate 36 disposed to face the susceptor 16 and a base member 38 supporting the ceiling plate 36.

The ceiling plate 36 is disposed to face the susceptor 16, and a plurality of gas holes 37 are provided in the ceiling plate 36 to eject the processing gas into the processing container 10. The ceiling plate 36 is formed of, for example, silicon or SiC.

The base member 38 is made of a conductive material (e.g., aluminum having an anodized surface), and is configured to detachably support the ceiling plate 36 on the lower portion thereof.

A gas diffusion space 40 is formed inside the base member 38 so as to supply the processing gas to the plurality of gas holes 37. A plurality of gas flow holes 41 are formed at the bottom of the base member 38 so as to be located below the gas diffusion space 40. The plurality of gas flow holes 41 are in communication with the plurality of gas holes 37, respectively.

The base member 38 is provided with a gas introduction port 62 so as to introduce the processing gas into the gas diffusion space 40. One end of a gas supply pipe 64 is connected to the gas introduction port 62. A processing gas source 66 is connected to the other end of the gas supply pipe 64 so as to supply the processing gas. A mass flow controller (MFC) 68 and an opening/closing valve 70 are provided in the gas supply pipe 64 in this order from the upstream side. Then, the processing gas for, for example, a plasma etching, is supplied from the processing gas source 66 to the gas diffusion space 40 through the gas supply pipe 64, and diffused and ejected into the processing container 10 in the form of shower through the gas flow holes 41 and the gas holes 37 from the gas diffusion space 40.

The shower head 34 is provided with a temperature adjustment mechanism to adjust the temperature of the ceiling plate 36. For example, a coolant flow path 92 is formed inside the base member 38. The coolant flow path 92 is connected to a chiller unit provided outside the processing container 10 through a pipe, and thus the coolant is circulated and supplied. That is, in the shower head 34, a coolant circulation system including the coolant flow path 92, the pipe, and the chiller unit is constructed as a temperature adjustment mechanism. The chiller unit is configured to be able to control the temperature or the flow rate of the coolant supplied to the coolant flow path 92 by receiving a control signal from the control unit 100 described later. The control unit 100 controls the temperature of the ceiling plate 36 by controlling the temperature or the flow rate of the coolant supplied from the chiller unit to the coolant flow path 92.

A first RF power supply 48 is electrically connected to the shower head 34 as the upper electrode through a low pass filter (LPF) (not illustrated), a matcher 46, and a power feeding rod 44. The first RF power supply 48 is a power supply for plasma generation, and supplies RF power having a frequency of 13.56 MHz or higher (e.g., 60 MHz) to the shower head 34. The matcher 46 matches a load impedance the internal (or output) impedance of the first RF power supply 48. The matcher 46 functions such that the output impedance of the first RF power supply 48 and the load impedance apparently match when plasma is generated in the processing container 10. The output terminal of the matcher 46 is connected to the upper end of the power feeding rod 44.

Meanwhile, a variable DC power supply 50 is electrically connected to the shower head 34. The variable DC power supply 50 may be a bipolar power supply. Specifically, the variable DC power supply 50 is connected to the shower head 34 through the matcher 46 and the power feeding rod 44, so that the on/off of power feeding is enabled by an on/off switch 52. The polarity and current/voltage of the variable DC power supply 50 and the on/off of the on/off switch 52 are controlled by the control unit 100 described later.

In addition, a cylindrical ground conductor 10a is provided to extend from the side wall of the processing container 10 to a position higher than the height position of the shower head 34. The ceiling wall portion of the cylindrical ground conductor 10a is electrically insulated from the power feeding rod 44 by a cylindrical insulating member 44a.

A second RF power supply 90 is electrically connected to the susceptor 16 serving as the lower electrode via a matcher 88. The second RF power supply 90 is a power supply for ion attraction (for bias), and supplies RF power having a frequency in the range of 300 kHz to 13.56 MHz (e.g., 2 MHz) to the susceptor 16. The matcher 88 is a matcher for matching the load impedance to the internal (or output) impedance of the second RF power supply 90. The matcher 88 functions such that the internal impedance of the second RF power supply 90 and the load impedance apparently match when plasma is generated in the processing container 10.

An exhaust port 80 is provided in the bottom of the processing container 10, and an exhaust device 84 is connected to the exhaust port 80 through an exhaust pipe 82. The exhaust device 84 has a vacuum pump such as, for example, a turbo molecular pump, and is configured to be capable of decompressing the inside of the processing container 10 to a desired degree of vacuum. In addition, a carry-in/out port 12g for a wafer W is provided in the side wall of the processing container 10, and the carry-in/out port 12g is configured to be capable of being opened/closed by a gate valve 86. In addition, a deposit shield 11 is detachably installed along the inner wall of the processing container 10 so as to suppress etching by-product (deposit) from being deposited to the processing container 10. The deposit shield 11 is also provided on the outer periphery of the inner wall member 26. An exhaust plate 83 is provided between the deposit shield 11 on the chamber wall side of the bottom of the processing container 10 and the deposit shield 11 on the inner wall member 26 side of the processing container 10. For the deposit shield 11 and the exhaust plate 83, an aluminum material coated with ceramics (e.g., $Y_2O_3$) may be appropriately used.

A conductive member (a GND block) 91 connected to the ground in a DC manner is provided in a portion constituting the chamber inner wall of the deposit shield 11 at a height substantially the same as the height of the wafer W. Thus, abnormal discharge is suppressed.

The operation of the plasma processing apparatus 1 configured as described is totally controlled by the control unit 100. The control unit 100 is, for example, a computer, and controls each unit of the plasma processing apparatus 1.

Figure 2:
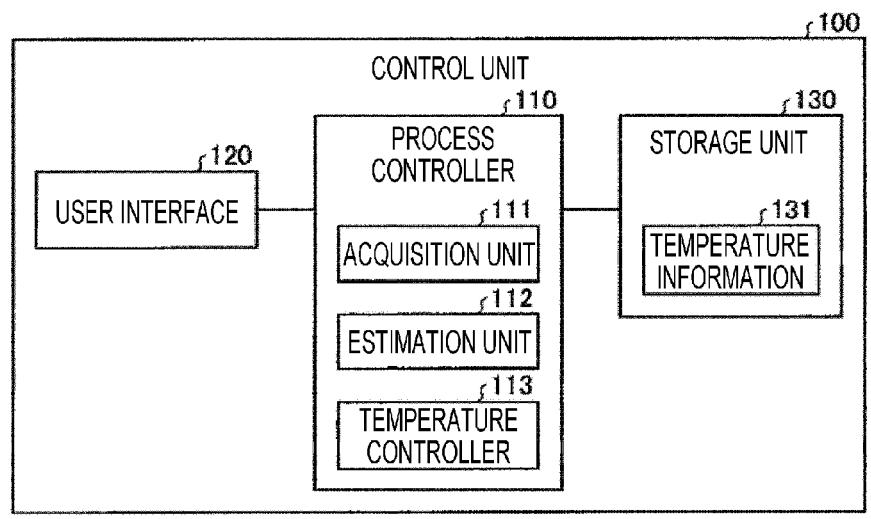
FIG. 2 is a block diagram schematically illustrating an exemplary configuration of a controller that controls the plasma processing apparatus according to the first embodiment.

FIG. 2 is a block diagram schematically illustrating an exemplary configuration of the control unit 100 that controls the plasma processing apparatus 1 according to the first embodiment. The control unit 100 includes a process controller 110, a user interface 120, and a storage unit 130.

The process controller 110 includes a central processing unit (CPU), and controls each unit of the plasma processing apparatus 1.

The user interface 120 includes, for example, a keyboard configured to allow a process manager to input commands for managing the plasma processing apparatus 1 therethrough, and a display configured to visualize and display the operation situation of the plasma processing apparatus 1.

The storage unit 130 stores, for example, a control program (software) for implementing various processings executed in the plasma processing apparatus 1 under the control of the process controller 110, and a recipe in which, for example, processing condition data is stored. For example, the storage unit 130 stores temperature information 131. Recipes such as, for example, a control program and processing condition data may also be used in the state of being stored in a computer-recording media (e.g., a hard disk, an optical disk such as, for example, a DVD, a flexible disk, and a semiconductor memory) readable by a computer. Alternatively, the recipes such as, for example, a control program and processing condition data, may be used online by causing the recipes to be frequently transmitted from other devices through, for example, a dedicated line, as needed.

The temperature information 131 is data indicating a relationship of the temperature of the ceiling plate 36 with respect to a combination of a parameter related to the generation of plasma of a processing gas ejected from the shower head 34 toward the wafer W and a pressure in the gas diffusion space 40 in the base member 38. For example, when a plurality of plasma processings are successively performed on a wafer W, the temperature information 131 is prepared for each combination of a parameter related to plasma generation and the pressure in the gas diffusion space 40 in the base member 38, which are applied to the plasma processings. In the present embodiment, the parameter related to plasma generation is a value of RF power supplied from the first RF power supply 48 to the shower head 34 (hereinafter, simply referred to as "RF power").

Figure 3:
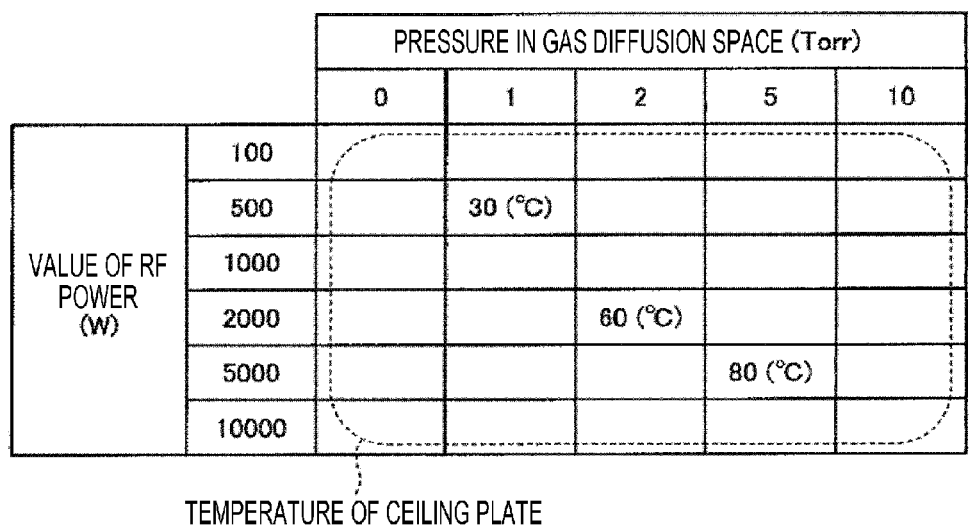
FIG. 3 is a diagram illustrating an exemplary relationship of the temperature of a ceiling plate with respect to a combination of values of RF power and the pressure in a gas diffusion space in a base member.

FIG. 3 is a diagram illustrating an exemplary relationship of the temperature of the ceiling plate 36 with respect to a combination of values of RF power and the pressure in the gas diffusion space 40 in the base member 38. FIG. 3 represents, for example, results obtained by measuring the temperature of the ceiling plate 36 by performing a plasma processing while changing the combination of values of RF power and the pressure in the gas diffusion space 40 in the base member 39 in the state in which the temperature and the flow rate of the coolant supplied to the coolant flow path 92 provided in the base member 38 are kept constant. In addition, in the measurement of FIG. 3, it is assumed that the temperature and the flow rate of the coolant supplied to the coolant flow path 92 provided in the base member 38 are maintained at 30° C. and 20 l/min), respectively.

As represented in FIG. 3, the temperature of the ceiling plate 36 is changed depending on the combination of values of RF power and the pressure in the gas diffusion space 40 in the base member 38. From the event represented in FIG. 3, it may be seen that the amount of heat removed from the ceiling plate 36 to the coolant flow path 92 provided in the base member 38 changes under the influence of the pressure in the gas diffusion space 40 existing between the base member 38 and the ceiling plate 36 or the amount of heat input from the plasma to the ceiling plate 36.

In addition, for example, the relationship of the temperature of the ceiling plate 36 with respect to the combination of values of RF power and the pressure in the gas diffusion space 40 in the base member 38 is determined in advance through, for example, a test. For example, it is assumed that a plurality of plasma processings are successively performed on a wafer W. In this case, for each combination of values of RF power and the pressure in the gas diffusion space 40 in the base member 38, which are applied to the plasma processings, the relationship of the temperature of the ceiling plate 36 with respect to the combination of a value of RF power and the pressure in the gas diffusion space 40 in the base member 38 is determined in advance. Then, the relationship of the temperature of the ceiling plate 36 with respect to the combination of values of RF power and the pressure in the gas diffusion space 40 in the base member 38 is stored in the temperature information 131. The temperature information 131 is, for example, information of a formula for calculating the temperature of the ceiling plate 36 from the combination of values of RF power and the pressure in the gas diffusion space 40 in the base member 38. The temperature information 131 may be a table in which the temperature of the ceiling plate 36 is associated with the combination of values of RF power and the pressure in the gas diffusion space 40 in the base member 38.

Descriptions will be made referring back to FIG. 2. The process controller 110 includes an internal memory that stores programs or data, reads a control program stored in the storage unit 130, and executes a processing of the read control program. The process controller 110 functions as various processing units when the control program operates. For example, the process controller 110 includes an acquisition unit 111, an estimation unit 112, and a temperature controller 113.

In the plasma processing apparatus 1, as described above, the amount of heat removed from the ceiling plate 36 to the coolant flow path 92 provided in the base member 38 changes under the influence of the pressure in the gas diffusion space 40 existing between the base member 38 and the ceiling plate 36 or the amount of heat input from the plasma to the ceiling plate 36. For this reason, in the plasma processing apparatus 1, there is a possibility that the temperature of the ceiling plate 36 may change from a target temperature when performing a plasma processing on the wafer W. As a result, in the plasma processing apparatus 1, it may become difficult to control the temperature of the ceiling plate 36 with high accuracy.

In addition, in the plasma processing apparatus 1, a temperature adjustment mechanism for adjusting the temperature of the ceiling plate 36 is controlled using the relationship of the temperature of the ceiling plate 36 with respect to the combination of values of RF power which are parameters related to the generation of plasma and the pressure in the gas diffusion space 40 in the base member 38.

The acquisition unit 111 acquires a combination of values of RF power which are parameters related to the generation of plasma and the pressure in the gas diffusion space 40 in the base member 38. For example, the acquisition unit 111 reads and acquires a combination of RF power values and the pressure in the gas diffusion space 40 in the base member 38 from the recipe such as, for example, processing condition data stored in the storage unit 130. The pressure in the gas diffusion space 40 in the base member 38 may have a value converted from the flow rate of the processing gas supplied to the gas diffusion space 40 using a predetermined conversion formula. For example, when a plurality of plasma processings are successively performed on a wafer W, the acquisition unit 111 acquires the combination of a value of RF power and the pressure in the gas diffusion space 40 in the base member 38, which are to be applied to each plasma processing before each plasma processing is initiated.

The estimation unit 112 estimates the temperature of the ceiling plate 36, which corresponds to a combination of the value of RF power and the pressure in the gas diffusion space 40 in the base member 38, which have been acquired by the acquisition unit 111, with reference to the temperature information 131. For example, when a plurality of plasma processings are successively performed on a wafer W, the temperature information 131 is prepared for each of the combinations of values of RF power and the pressure in the gas diffusion space 40 in the base member 38, which are applied to the plasma processings. In this case, the estimation unit 112 estimates the temperature of the ceiling plate 36, which corresponds to a combination of a value of RF power and the pressure in the gas diffusion space 40 the base member 38, which have been acquired by the acquisition unit 111, with reference to the temperature information 131 corresponding to each plasma processing before each plasma processing is initiated.

Here, an exemplary method of estimating the temperature of the ceiling plate 36 will be described. For example, it is assumed that the relationship of the temperature of the ceiling plate 36 with respect to a combination of values of RF power and the pressure in the gas diffusion space 40 in the base member 38, as represented in FIG. 3, are stored in the temperature information 131. Further, it is assumed that the combination of 2000 (W) and 2 (Torr) is acquired by the acquisition unit 111 as a combination of the value of RF power and the pressure in the gas diffusion space 40 in the base member 38. In this case, the estimation unit 112 estimates that the temperature of the ceiling plate 36, which corresponds to the combination of 2000 (W) and 2 (Torr), is "60 (° C.)" with reference to the temperature information 131.

The temperature controller 113 controls the temperature of the ceiling plate 36, which is estimated by the estimation unit 112, to a target temperature by controlling the temperature or the flow rate of the coolant supplied from the chiller unit to the coolant flow path 92 when the plasma processing is performed on the wafer W mounted on the susceptor 16. For example, it is assumed that a plurality of plasma processings are successively performed on the wafer W. In this case, the temperature controller 113 controls the temperature of the ceiling plate 36, which is estimated by the estimation unit 112, to the target temperature by circulating the coolant having a predetermined temperature and a predetermined flow rate from the chiller unit to the coolant flow path 92 when performing each plasma processing on the wafer W.

Thus, in the plasma processing apparatus 1, even if the temperature of the ceiling plate 36 changes from the target temperature due to a difference in the value of RF power or the pressure of the gas diffusion space 40 in the base member 38, it is possible to maintain the temperature of the ceiling plate 36 at the target temperature. As a result, in the plasma processing apparatus 1, it is possible to control the temperature of the ceiling plate 36 with high accuracy.

Figures 4, 5:
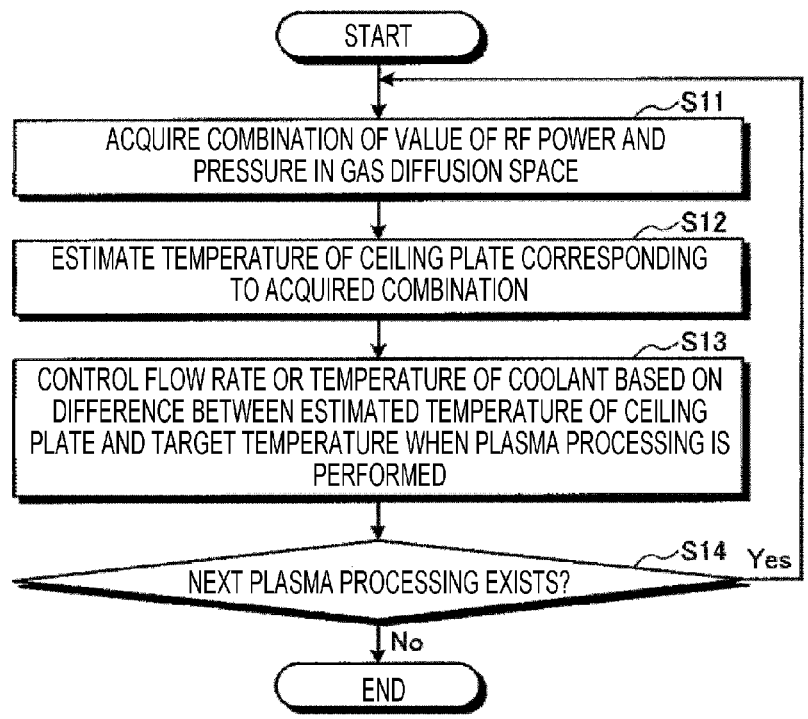
FIG. 4 is a diagram for explaining an exemplary method of controlling the temperature of a ceiling plate according to the first embodiment.
FIG. 5 is a flowchart illustrating an exemplary flow of a temperature control method according to the first embodiment.

Here, an exemplary method of controlling the temperature of the ceiling plate 36 will be described. FIG. 4 is a diagram for explaining an exemplary method of controlling the temperature of the ceiling plate 36 according to the first embodiment. In FIG. 4, it is assumed that the temperature of the ceiling plate 36 estimated by the estimation unit 112 is "60 (° C.)," and the target temperature of the ceiling plate 36 is "40 (° C.)." In this case, the temperature controller 113 controls the temperature or the flow rate of the coolant supplied from the chiller unit to the coolant flow path 92 based on the difference between the estimated temperature "60 (° C.)" of the ceiling plate and the target temperature "40 (° C.)." For example, as illustrated in FIG. 4, the temperature controller 113 controls the temperature of the ceiling plate 36 to the target temperature "40 (° C.)" by reducing the temperature of the coolant supplied from the chiller unit to the refrigerant flow path 92 from "30 (° C.)" to "10 (° C.)." In addition, for example, as represented in FIG. 4, the temperature controller 113 controls the temperature of the ceiling plate 36 to the target temperature "40 (° C.)" by increasing the flow rate of the refrigerant supplied from the chiller unit to the refrigerant flow path 92 from "20 (l/min)" to "30 (l/min)."

Next, a temperature control method using the plasma processing apparatus 1 according to the first exemplary embodiment will be described. FIG. 5 is a flowchart illustrating an exemplary flow of a temperature control method according to the first embodiment.

As illustrated in FIG. 5, the acquisition unit 111 reads and acquires a combination of a value of RF power and the pressure in the gas diffusion space 40 in the base member 38 from a recipe such as, for example, processing condition data stored in the storage unit 130 (step S11).

The estimation unit 112 estimates the temperature of the ceiling plate 36, which correspond to the combination of the value of RF power and the pressure in the gas diffusion space 40 in the base member 38, which have been acquired by the acquisition unit 111, with reference to the temperature information 131 (step S12).

When a plasma processing is performed on the wafer W placed on the susceptor 16, the temperature controller 113 controls the temperature or the flow rate of the coolant supplied from the chiller unit to the coolant flow path 92 based on the difference between the estimated temperature of the ceiling plate 36 and the target temperature (step S13).

The plasma processing apparatus 1 returns the processing to step S11, when the next plasma processing exists (Yes in step S14). Thus, steps S11 to S13 are repeated. That is, the acquisition unit 111 acquires a combination of a value of RF power and the pressure in the gas diffusion space 40 in the base member 38, which are applied to the next plasma processing before the next plasma processing is initiated. The estimation unit 112 estimates the temperature of the ceiling plate 36, which corresponds to the combination of the value of RF power and the pressure in the gas diffusion space 40 in the base member 38, which have been acquired by the acquisition unit 111, with reference to the temperature information 131 according to the next plasma processing before the next plasma processing is initiated. Then, when the next plasma processing is performed on the wafer W, the temperature controller 113 controls the temperature or the flow rate of the coolant supplied from the chiller unit to the coolant flow path 92 based on the difference between the estimated temperature of the ceiling plate 36 and the target temperature.

Meanwhile, when the next plasma processing does not exist (No in step S14), the plasma processing apparatus 1 terminates the processing.

As described above, the plasma processing apparatus 1 according to the first embodiment includes the shower head 34, the coolant flow path 92, the acquisition unit 111, the estimation unit 112, and the temperature controller 113. The shower head 34 is disposed to face the stage on which the wafer W is placed, and includes the ceiling plate 36 having a plurality of gas holes 37 formed therein to eject the processing gas into the processing container 10. In addition, the shower head 34 includes the base member 38 that supports the ceiling plate 36 and has the gas diffusion space 40 formed therein to supply the processing gas to the gas holes 37. The coolant flow path 92 is provided in the shower head 34 (the base member 38). The acquisition unit 111 acquires a combination of a value of RF power, which is a parameter related to the generation of plasma of the processing gas ejected from the shower head 34 toward the wafer W and the pressure in the gas diffusion space 40 in the base member 38. The estimation unit 112 estimates the temperature of the ceiling plate 36 corresponding to the acquired combination of the value of RF power and the pressure in the gas diffusion space 40 in the base member 38 with reference to the temperature information 131 indicating the temperature of the ceiling plate 36 with respect to the combination of the value of RF power and the pressure in the gas diffusion space 40 in the base member 38. When performing the plasma processing on the wafer W, the temperature controller 113 controls the coolant circulation system such that the estimated temperature of the ceiling plate 36 becomes the target temperature. Thus, in the plasma processing apparatus 1, it is possible to control the temperature of the ceiling plate 36 with high accuracy.

Second Embodiment

Figure 6:
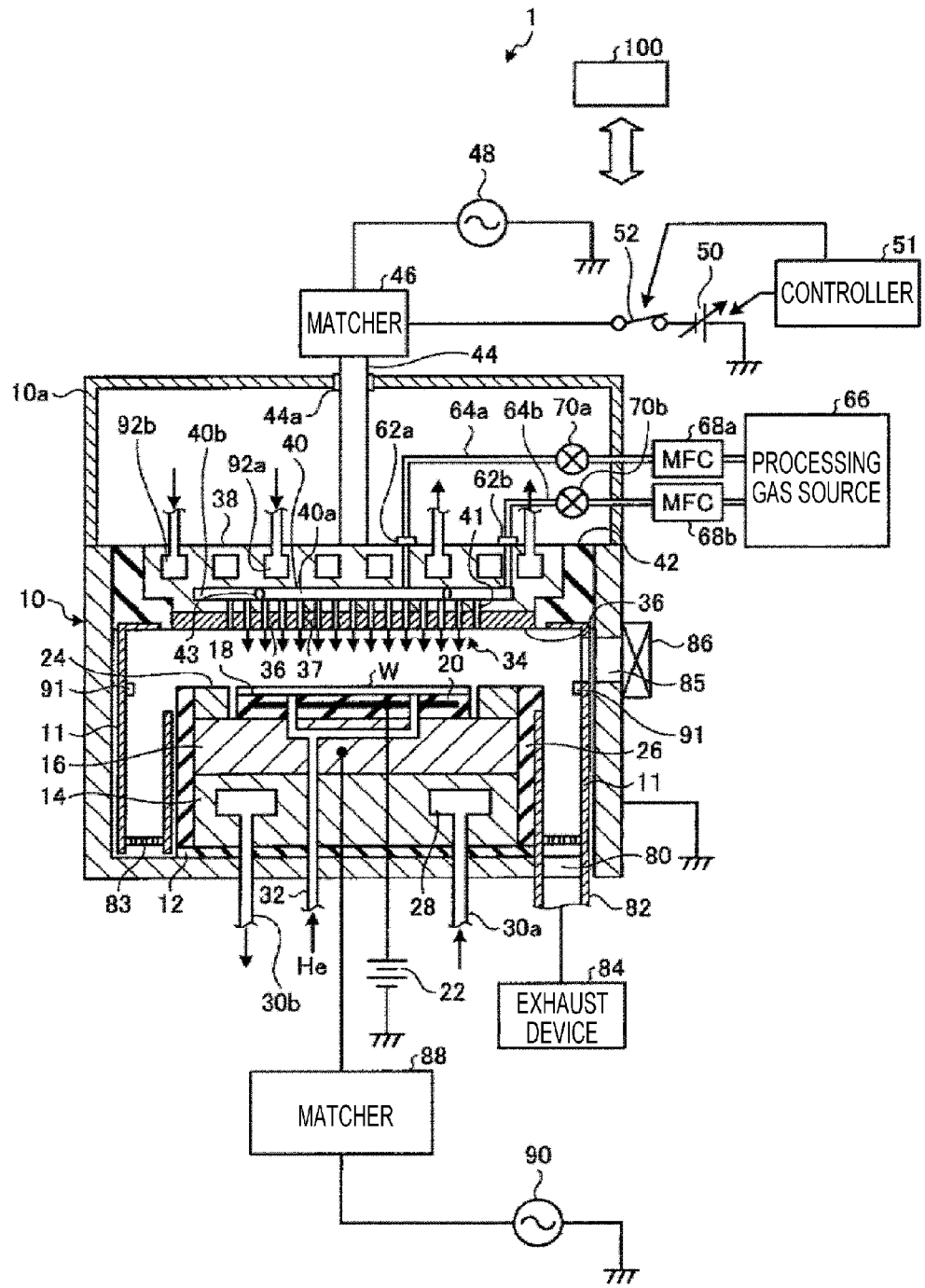
FIG. 6 is a schematic cross-sectional view illustrating a plasma processing apparatus according to a second embodiment.

Next, a second embodiment will be described. FIG. 6 is a schematic cross-sectional view illustrating a plasma processing apparatus 1 according to a second embodiment. The plasma processing apparatus 1 according to the second embodiment has substantially the same configuration as that of the plasma processing apparatus 1 according to the first embodiment illustrated in FIG. 2. Thus, the same or similar components will be denoted by the same symbols, and a redundant description will be omitted.

A gas diffusion space 40 is formed inside a base member 38 so as to supply the processing gas to a plurality of gas holes 37. The gas diffusion space 40 is divided into a central space 40a and an edge space 40b in the radial direction of a wafer W from the center side along by, for example, an annular partition member 43 such as, for example, an O-ring. Thus, the gas diffusion space 40 is divided into a plurality of divided spaces (the central space 40a and the edge space 40b) in the radial direction of the wafer W.

In the base member 38, two gas introduction ports 62a and 62b in order to introduce the processing gas into the central space 40a and the edge space 40b. One end of a gas supply pipe 64a is connected to the gas introduction port 62a, and one end of a gas supply pipe 64b is connected to the gas introduction port 62b. A processing gas source 66 is connected to the other end of the gas supply pipe 64a and the other end of the gas supply pipe 64b. In the gas supply pipe 64a, an MFC 68a and an opening/closing valve 70a are provided in this order from the upstream side. In the gas supply pipe 64b, an MFC 68b and an opening/closing valve 70b are provided in this order from the upstream side. Then, a processing gas for, for example, a plasma etching, is supplied from the processing gas source 66 to the central space 40a and the edge space 40b through the gas supply pipes 64a and 64b. The processing gas supplied to the central space 40a and the edge space 40b is diffused and ejected in the form of a shower from the central space 40a and the edge space 40b through the gas flow holes 41 and the gas holes 37.

The shower head 34 is provided with a temperature adjustment mechanism to adjust the temperature of the ceiling plate 36. The temperature adjustment mechanism is provided at each of a plurality of positions, which respectively correspond to a plurality of divided spaces (the central space 40a and the edge space 40b) in the shower head 34. For example, a coolant flow path 92a is formed at a position corresponding to the central space 40a inside the base member 38, and a coolant flow path 92b is formed at a position corresponding to the edge space 40b inside the base member 38. The coolant flow path 92a is connected to a first chiller unit provided outside the processing container 10 through a pipe, and thus the coolant is circulated and supplied. The coolant flow path 92b is connected to a second chiller unit provided outside the processing container 10 through a pipe, and thus the coolant is circulated and supplied. That is, in the shower head 34 a first coolant circulation system including a coolant flow path 92a, a pipe, and a first chiller unit, and a second coolant circulation system including a coolant flow path 92b, a pipe, and a second chiller unit are constructed as two temperature adjustment mechanisms. The first chiller unit is configured to be able to control the temperature or the flow rate of the coolant supplied to the coolant flow path 92a by receiving a control signal from the control unit 100 described later. The second chiller unit is configured to be able to control the temperature or the flow rate of the coolant supplied to the coolant flow path 92b by receiving a control signal from the control unit 100 described later. The control unit 100 controls the temperature of the ceiling plate 36 by independently controlling the temperature or the flow rate of the coolant supplied from the first chiller unit to the coolant flow path 92a and the temperature or the flow rate of the coolant supplied from the second chiller unit to the coolant flow path 92b.

Figures 7, 8:
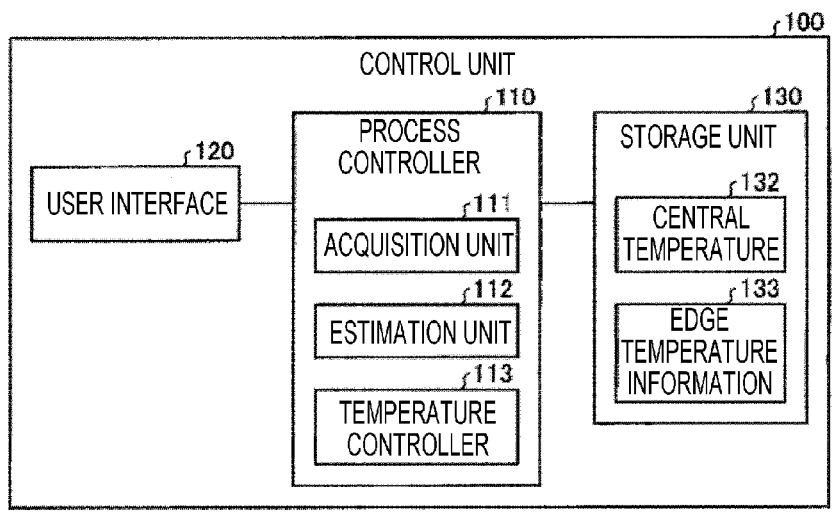
FIG. 7 is a block diagram schematically illustrating an exemplary configuration of a controller that controls a plasma processing apparatus according to the first embodiment.
FIG. 8 is a diagram illustrating an exemplary relationship of the temperature of a ceiling plate with respect to a combination of values of RF power and the pressure of a central space in the base member.

Next, the control unit 100 according to the second embodiment will be described in detail. FIG. 7 is a block diagram schematically illustrating an exemplary configuration of the control unit 100 that controls the plasma processing apparatus 1 according to the second embodiment. The control unit 100 according to the second embodiment has substantially the same configuration as that of the plasma processing apparatus 1 according to the first embodiment illustrated in FIG. 2. Thus, the same or similar components will be denoted by the same symbols, and a redundant description will be omitted.

The storage unit 130 stores central temperature information 132 and edge temperature information 133. The central temperature information 132 and the edge temperature information 133 are data obtained by preparing the temperature information 131 represented in FIG. 2 for each divided space in the shower head 34. That is, the central temperature information 132 is data indicating a relationship of the temperature of the ceiling plate 36 with respect to a combination of a parameter related to the generation of plasma of a processing gas ejected from the shower head 34 toward the wafer W and the pressure in the central space 40a in the base member 38. The edge temperature information 133 is data indicating a relationship of the temperature of the ceiling plate 36 with respect to a combination of a parameter related to the generation of plasma of a processing gas ejected from the shower head 34 toward the wafer W and the pressure in the edge space 40b in the base member 38. For example, when a plurality of plasma processings are successively performed on the wafer W, the central temperature information 132 is prepared for each of combinations of parameters related to plasma generation and the pressure in the central space 40a in the base member 38, which are applied to the plasma processings. In addition, the edge temperature information 133 is prepared for each of combinations of parameters related to plasma generation and the pressure in the edge space 40b in the base member 38, which are applied to the plasma processings. In the present embodiment, the parameters related to plasma generation are the values of RF power supplied from the first RF power supply 48 to the shower head 34 (hereinafter, simply referred to as "RF power").

FIG. 8 is a diagram illustrating an exemplary relationship of the temperature of the ceiling plate 36 with respect to a combination of values of RF power and the pressure in the central space 40a in the base member 38. FIG. 9 is a diagram illustrating an exemplary relationship of the temperature of the ceiling plate 36 with respect to a combination of values of RF power and the pressure in the edge space 40b in the base member 38. FIG. 8 represents results obtained by measuring the temperature of the central portion of the ceiling plate 36 by performing plasma processings while changing the combination of a value of RF power and the pressure in the central space 40a in the base member 39 in the state in which the temperature and the flow rate of the coolant supplied to the coolant flow path 92a provided in the base member 38 are kept constant. FIG. 9 represents results obtained by measuring the temperature of the edge portion of the ceiling plate 36 by performing plasma processings while changing the combination of a value of RF power and the pressure in the edge space 40b in the base member 39 in the state in which the temperature and the flow rate of the coolant supplied to the coolant flow path 92b provided in the base member 38 are kept constant. In the measurement of FIG. 8, it is assumed that the temperature and the flow rate of the coolant supplied to the coolant flow path 92a provided in the base member 38 are maintained at 30 (° C.) and 20

(l/min), respectively. In the measurement of FIG. 9, it is assumed that the temperature and the flow rate of the coolant supplied to the coolant flow path 92b provided in the base member 38 are maintained at 30 (° C.) and 20 (l/min), respectively.

As represented in FIG. 8, the temperature of the central portion of the ceiling plate 36 is changed depending on the combination of the value of RF power and the pressure in the central space 40a in the base member 38. In addition, as represented in FIG. 9, the temperature of the edge portion of the ceiling plate 36 is changed depending on the combination of the value of RF power and the pressure in the edge space 40b in the base member 38. From this event, it may be seen that the amount of heat removed from the ceiling plate 36 to the coolant flow paths 92a, 92b provided in the base member 38 changes under the influence of the pressure in the central space 40a and the edge space 40b existing between the base member 38 and the ceiling plate 36 or the amount of heat input from the plasma to the ceiling plate 36.

In addition, for example, the relationship of the temperature of the central portion of the ceiling plate 36 with respect to the combination of values of RF power and the pressure in the central space 40a in the base member 38 is determined in advance through, for example, a test. In addition, the relationship of the temperature of the edge portion of the ceiling plate 36 with respect to the combination of values of RF power and the pressure in the edge space 40b in the base member 38 is determined in advance. For example, it is assumed that a plurality of plasma processings are successively performed on the wafer W. In this case, for each combination of a value of RF power and the pressure in the central space 40a in the base member 38, which are applied to the plasma processings, the relationship of the temperature of the central portion of the ceiling plate 36 with respect to the combination of the value of RF power and the pressure in the central space 40a in the base member 38 is determined in advance. In addition, for each combination of the value of RF power and the pressure in the central space 40a in the base member 38, which are applied to the plasma processings, the relationship of the temperature of the edge portion of the ceiling plate 36 with respect to the combination of the value of RF power and the pressure in the edge space 40b in the base member 38 is determined in advance. Then, the relationship of the temperature of the central portion of the ceiling plate 36 with respect to the combination of the value of RF power and the pressure in the central space 40a in the base member 38 is stored in the central temperature information 132. In addition, the relationship of the temperature of the edge portion of the ceiling plate 36 with respect to the combination of the value of RF power and the pressure in the edge space 40b in the base member 38 is stored in the edge temperature information 133. The central temperature information 132 is, for example, information of a formula for calculating the temperature of the central portion of the ceiling plate 36 from the combination of values of RF power and the pressure in the central space 40a in the base member 38. The central temperature information 132 may be a table in which the temperature of the central portion of the ceiling plate 36 is associated with a combination of values of RF power and the pressure in the central space 40a in the base member 38. In addition, the edge temperature information 133 is, for example, information of a formula for calculating the temperature of the edge portion of the ceiling plate 36 from the combination of values of RF power and the pressure in the edge space 40b in the base member 38. The edge temperature information 133 may be a table in which the temperature of the edge portion of the ceiling plate 36 is associated with a combination of values of RF power value and the pressure in the edge space 40b in the base member 38.

The acquisition unit 111 acquires, for each divided space (each of the central space 40a and the edge space 40b) in the shower head 34, a combination of values of RF power and the pressure in each divided space in the base member 38. For example, the acquisition unit 111 reads and acquires a combination of values of RF power and the pressure in the central space 40a in the base member 38 and a combination of values of RF power and the pressure in the edge space 40b in the base member 38 from the recipe such as, for example, processing condition data stored in the storage unit 130. The pressure in the central space 40a in the base member 38 may have a value converted from the flow rate of the processing gas supplied to the central space 40a using a predetermined conversion formula. The pressure in the edge space 40b in the base member 38 may have a value converted from the flow rate of the processing gas supplied to the edge space 40b using a predetermined conversion formula. The flow rate of the processing gas supplied to the central space 40a and the flow rate of the processing gas supplied to the edge space 40b are calculated using a radical distribution control (RDC) ratio which is the distribution ratio of the processing gas in relation to the central space 40a and the edge space 40b, and the total flow rate of the processing gas. The RDC ratio and the total flow rate of the processing gas are included in a recipe such as, for example, processing condition data stored in the storage unit 130. In addition, when a plurality of plasma processings are successively performed on the wafer W, the acquisition unit 111 acquires, for each divided space, a combination of values of RF power and the pressure in each divided space in the base member 38, which are to be applied to each plasma processing before each plasma processing is initiated.

The estimation unit 112 estimates, for each divided space in the shower head 34, temperature corresponding to a combination acquired by the acquisition unit 111 with reference to temperature information corresponding to each divided space (each of the central temperature information 132 and the edge temperature information 133). For example, when a plurality of plasma processings are successively performed on the wafer W, the central temperature information 132 is prepared for each combination of values of RF power and the pressure in the central space 40a in the base member 38, which are applied to the plasma processings. In addition, the edge temperature information 133 is prepared for each combination of values of RF power and the pressure in the edge space 40b in the base member 38, which are applied to the plasma processings. In this case, the estimation unit 112 estimates, for each divided space, the temperature of the ceiling plate 36, which corresponds to a combination acquired by the acquisition unit 111, with reference to temperature information corresponding to each divided space before each plasma processing is initiated.

Here, an exemplary method of estimating the temperature of the ceiling plate 36 will be described. For example, it is assumed that the relationship of the temperature of the central portion of the ceiling plate 36 with respect to a combination of values of RF power and the pressure in the central space 40a in the base member 38, as represented in FIG. 8, is stored in the central temperature information 132. In addition, it is assumed that the relationship of the temperature of the edge portion of the ceiling plate 36 with respect to a combination of values of RF power and the pressure in the edge space 40b in the base member 38, as represented in FIG. 9, is stored in the edge temperature information 133. In addition, it is assumed that the combination of 2000 (W) and 2 (Torr) is acquired by the acquisition unit 111 as a combination of a value of RF power and the pressure in the central space 40a in the base member 38. In addition, it is assumed that the combination of 2000 (W) and 10 (Torr) is acquired by the acquisition unit 111 as a combination of a value of RF power and the pressure in the edge space 40b in the base member 38. In this case, the estimation unit 112 estimates, for the central space 40a, that the temperature of the central portion of the ceiling plate 36, which corresponds to the combination of 2000 (W) and 2 (Torr), is "60 (° C.)," with reference to the central temperature information 132. In addition, the estimation unit 112 estimates, for the edge space 40b, that the temperature of the edge portion of the ceiling plate 36, which corresponds to the combination of 2000 (W) and 10 (Torr), is "40 (° C.)," with reference to the edge temperature information 133.

The temperature controller 113 controls, for each divided space in the shower head 34, the temperature of the ceiling plate 36, which is estimated by the estimation unit 112, to the target temperature when performing the plasma processing on the wafer W placed on the susceptor 16. That is, the temperature controller 113 controls, for the central space 40a, the temperature of the central portion of the ceiling plate 36, which is estimated by the estimation unit 112, to the target temperature by controlling the temperature or the flow rate of the coolant supplied from the first chiller unit to the coolant flow path 92a (hereinafter, referred to as "central coolant"). In addition, the temperature controller 113 controls, for the edge space 40b, the temperature of the edge portion of the ceiling plate 36, which is estimated by the estimation unit 112, to the target temperature by controlling the temperature or the flow rate of the coolant supplied from the second chiller unit to the coolant flow path 92b (hereinafter, referred to as "edge coolant"). For example, it is assumed that a plurality of plasma processings are successively performed on the wafer W. In this case, the temperature controller 113 controls the temperature of the central portion of the ceiling plate 36, which is estimated by the estimation unit 112, to the target temperature by circulating the central coolant having a predetermined temperature and a flow rate from the first chiller unit to the coolant flow path 92a when performing each plasma processing on the wafer W. In addition, the temperature controller 113 controls the temperature of the edge portion of the ceiling plate 36, which is estimated by the estimation unit 112, to the target temperature by circulating the edge coolant having a predetermined temperature and a flow rate from the second chiller unit to the coolant flow path 92b.

Thus, in the plasma processing apparatus 1, even if the temperature of the ceiling plate 36 changes from the target temperature due to a difference in an RF power value and the pressure in each divided space in the base member 38, it is possible to maintain the temperature of the central portion and the edge portion of the ceiling plate 36 at the target temperature. As a result, in the plasma processing apparatus 1, it is possible to control the temperature of the ceiling plate 36 with high accuracy, and it is also possible to improve the in-plane uniformity of the temperature of the ceiling plate 36.

Figure 11:
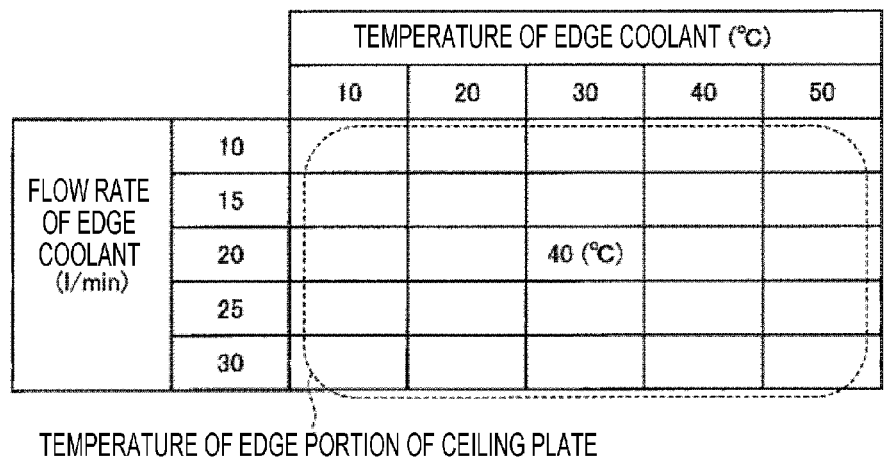
FIG. 11 is a diagram for explaining an exemplary method of controlling the temperature of a ceiling plate according to the second embodiment.

Here, an exemplary method of controlling the temperature of the ceiling plate 36 will be described. FIGS. 10 and 11 are diagrams for explaining an exemplary method of controlling the temperature of the ceiling plate 36 according to the second embodiment. In FIGS. 10 and 11, it is assumed that the temperature of the ceiling plate 36 estimated by the estimation unit 112 is "60 (° C.)," and the temperature of the ceiling plate 36 estimated by the estimation unit 112 is "40 (° C.)." In addition, it is assumed that the target temperature of the ceiling plate 36 is "40 (° C.)." In this case, the temperature controller 113 controls the temperature or the flow rate of the central coolant based on the difference between the estimated temperature "60 (° C.)" of the central portion of the ceiling plate 36 and the target temperature "40 (° C.)." For example, as represented in FIG. 10, the temperature controller 113 controls the temperature of the central portion of the ceiling plate 36 to the target temperature "40 (° C.)" by reducing the temperature of the central coolant from "30 (° C.)" to "10 (° C.)." In addition, for example, as represented in FIG. 10, the temperature controller 113 controls the temperature of the central portion of the ceiling plate 36 to the target temperature "40 (° C.)" by increasing the flow rate of the central coolant from "20 (l/min)" to "30 (l/min)." Furthermore, the temperature controller 113 controls the temperature or the flow rate of the edge coolant based on the difference between the estimated temperature "40 (° C.)" of the edge portion of the ceiling plate 36 and the target temperature "40 (° C.)." For example, as illustrated in FIG. 11, the estimation unit 112 controls the temperature of the edge portion of the ceiling plate 36 to the target temperature "40 (° C.)" by maintaining the temperature of the edge coolant at "30 (° C.)" and maintaining the flow rate of the edge coolant at "20 (l/min)."

Figure 12:
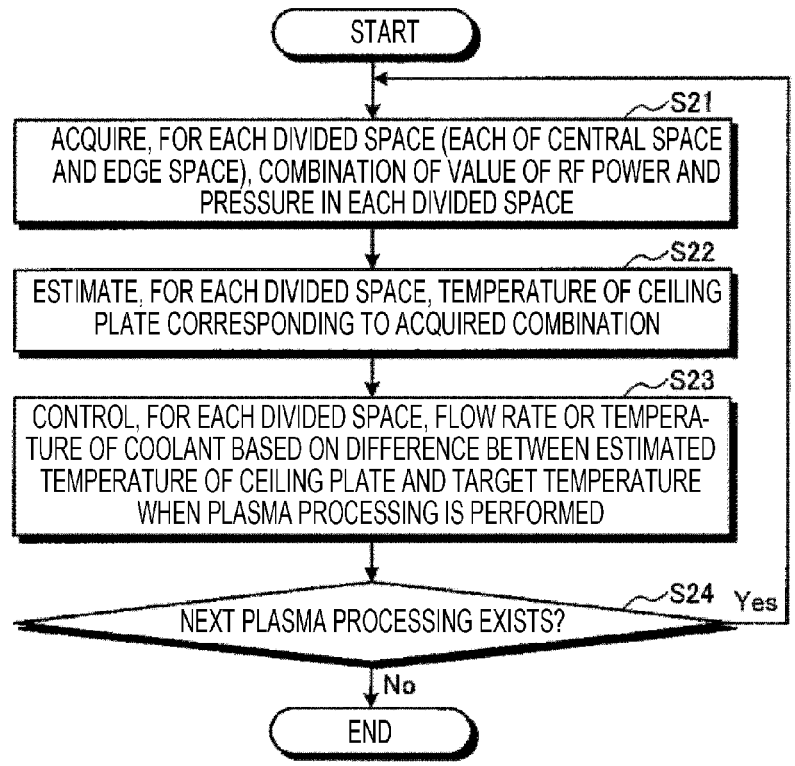
FIG. 12 is a flowchart illustrating an exemplary flow of a temperature control method according to the second embodiment.

Next, a temperature control method using the plasma processing apparatus 1 according to the second embodiment will be described. FIG. 12 is a flowchart illustrating an exemplary flow of a temperature control method according to the second embodiment.

As illustrated in FIG. 12, the acquisition unit 111 acquires, for each divided space (each of the central space 40a and the edge space 40b) in the shower head 34, a combination of a value of RF power and the pressure in each divided space in the base member 38 (step S21).

The estimation unit 112 estimates, for each divided space in the shower head 34, temperature corresponding to a combination acquired by the acquisition unit 111 with reference to temperature information corresponding to each divided space (each of the central temperature information 132 and the edge temperature information 133) (step S22).

The temperature controller 113 controls, for each divided space, the temperature or the flow rate of coolant based on the difference between the temperature of the ceiling plate 36, which is estimated by the estimation unit 112, and the target temperature when a plasma processing is performed on a wafer W placed on the susceptor 16 (step S23). That is, the temperature controller 113 controls the temperature or the flow rate of the central coolant based on the temperature difference between the estimated central portion of the ceiling plate 36 and the target temperature, and controls the temperature or the flow rate of the edge coolant based on the estimated temperature of the edge portion of the ceiling plate 36 and the target temperature.

The plasma processing apparatus 1 returns the processing to step S11 when the next plasma processing exists (Yes in step S24). Thus, steps S21 to S23 are repeated. That is, the acquisition unit 111 acquires, for each divided space, a combination of a value of RF power and the pressure in each divided space in the base member 38, which will be applied to the next plasma processing before the next plasma processing is initiated. The estimation unit 112 estimates, for each divided space, the temperature of the ceiling plate 36, which corresponds to the combination acquired by the acquisition unit 111, with reference to temperature information corresponding to each divided space before the next plasma processing is initiated. The temperature controller 113 controls, for each divided space, the temperature or the flow rate of coolant based on the difference between the temperature of the ceiling plate 36, which is estimated by the estimation unit 112, and the target temperature when the next plasma processing is performed on the wafer W placed on the susceptor 16.

Meanwhile, when the next plasma processing does not exist (No in step S24), the plasma processing apparatus 1 terminates the processing.

As described above, in the plasma processing apparatus 1 according to the second embodiment, each of a first coolant circulation system and a second coolant circulation system is controlled such that, for each divided space in the shower head 34, the estimated temperature of the ceiling plate 36 becomes the target temperature when a plasma processing is performed. As a result, in the plasma processing apparatus 1, it is possible to control the temperature of the ceiling plate 36 with high accuracy, and it is also possible to improve the in-plane uniformity of the temperature of the ceiling plate 36.

For example, in the embodiments described above, a case where parameters related to the generation of plasma are values of RF power supplied from the first RF power supply 48 to the shower head 34 has been described by way of an example, but the technology disclosed herein is not limited thereto. For example, the parameters related to the generation of plasma may include other parameters such as, for example, the pressure in the processing container 10, the polarity and current/voltage of the variable DC power supply 50, and the values of RF power of the second RF power supply 90.

In the embodiments described above, a case where the coolant flow paths (the coolant flow path 92 and the coolant flow paths 92a, 92b) in the shower head 34 function as a temperature adjustment mechanism for adjusting the temperature of the ceiling plate 36 has been described by way of an example, but the technology disclosed herein is not limited thereto. For example, the shower head 34 may be provided with a heater as the temperature adjustment mechanism. In addition, the type of coolant flowing in the coolant flow path may be switched.

In the embodiments described above, a case where the coolant flow paths (the coolant flow path 92 and the coolant flow paths 92a and 92b) are formed inside the base member 38 has been described by way of an example, but the technology disclosed herein is not limited thereto. For example, coolant flow paths (the coolant flow path 92 and the coolant flow paths 92a, 92b) may be formed inside the ceiling plate 36.

In the second embodiment described above, a case where the gas diffusion space 40 is divided into two divided spaces in the radial direction of the wafer W, but the technology is not limited thereto. The gas diffusion space 40 may be divided into three or more divided spaces in the radial direction of the wafer W.

In the second embodiment described above, a case where the gas diffusion space 40 is divided into two divided spaces in the radial direction of the wafer W, but the technology is not limited thereto. The gas diffusion space 40 may be divided into a plurality of divided spaces in the circumferential direction of the wafer W, or may be divided into a plurality of divided spaces in the combination of the radial direction and the circumferential direction of the wafer W.

In the second embodiment described above, even if a thermal resistor may be provided between the coolant flow path 92a and the coolant flow path 92b in order to thermally insulate the coolant flow path 92a and the coolant flow path 92b.

In addition, in the exemplary embodiments described above, descriptions have been made on the premise that a processing gas used for a plasma processing is constant, but the types of processing gases may be switched depending required process characteristics. Since the thermal conductivity varies depending on the type of a processing gas, the temperature information 131 also varies depending on the type of a processing gas. Accordingly, it is desirable to have temperature information 131 for each type of a processing gas used.

According to the present disclosure, it is possible to control the temperature of the ceiling plate of the shower head with high accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a shower head disposed to face a stage on which a substrate is placed, and including a ceiling plate having a plurality of gas holes formed therein so as to eject a processing gas into a processing container and a base configured to support the ceiling plate, the base including a space formed therein so as to supply the processing gas to the plurality of gas holes;
   a temperature adjustment mechanism including a coolant flow path provided in the shower head; and
   a controller configured to:
   acquire a combination of a parameter related to generation of plasma of the processing gas ejected from the shower head toward the substrate and a pressure in the space in the base;
   estimate temperature of the ceiling plate corresponding to the acquired combination of the parameter and the pressure in the space in the base with reference to temperature information indicating the temperature of the ceiling plate corresponding to the combination of the parameter and the pressure in the space in the base; and
   control the temperature adjustment mechanism such that the estimated temperature of the ceiling plate becomes a target temperature when a plasma processing is performed on the substrate.

2. The plasma processing apparatus of claim 1, wherein a plurality of plasma processings are successively performed on the substrate,
   the temperature information is prepared for each combination of the parameter and the pressure in the space in the base, which are applied to each of the plurality of plasma processings, and
   the controller is configured to:
   acquire the combination of the parameter and the pressure in the space in the base, which are applied to each of the plurality of plasma processings before each of the plurality of plasma processings is initiated,
   estimate the temperature of the ceiling plate corresponding to the acquired combination of the parameter and the pressure in the space in the base with reference to the temperature information corresponding to each of the plurality of plasma processings before each of the plasma processings is initiated, and control the temperature adjustment mechanism such that the estimated temperature of the ceiling plate becomes the target temperature when each of the plurality of plasma processings is performed on the substrate.

3. The plasma processing apparatus of claim 2, wherein the space in the base is divided into a plurality of divided spaces, the temperature adjustment mechanism is provided at each of a plurality of positions in the shower head that correspond to the plurality of divided spaces, respectively, the temperature information is prepared for each of the divided spaces, the controller is configured to:
acquire, for each of the divided spaces, the combination of the parameter and the pressure in each of the divided spaces in the base, estimate, for each of the divided spaces, the temperature of the ceiling plate corresponding to the acquired combination of the parameter and the pressure in the each of the divided spaces in the base with reference to the temperature information corresponding to each of the divided spaces, and control, for each of the divided spaces, the temperature adjustment mechanism such that the estimated temperature of the ceiling plate becomes the target temperature when a plasma processing is performed on the substrate.

4. The plasma processing apparatus of claim 1, wherein the space in the base is divided into a plurality of divided spaces, the temperature adjustment mechanism is provided at each of a plurality of positions in the shower head that correspond to the plurality of divided spaces, respectively, the temperature information is prepared for each of the divided spaces, the controller is configured to:
acquire, for each of the divided spaces, the combination of the parameter and the pressure in each of the divided spaces in the base, estimate, for each of the divided spaces, the temperature of the ceiling plate corresponding to the acquired combination of the parameter and the pressure in the each of the divided spaces in the base with reference to the temperature information corresponding to each of the divided spaces, and control, for each of the divided spaces, the temperature adjustment mechanism such that the estimated temperature of the ceiling plate becomes the target temperature when a plasma processing is performed on the substrate.

5. A temperature control method comprising:

providing a plasma processing apparatus including: a shower head disposed to face a stage on which a substrate is placed, and including a ceiling plate having a plurality of gas holes formed therein so as to eject a processing gas into a processing container, and a base configured to support the ceiling plate, the base including a space formed therein so as to supply the processing gas to the plurality of gas holes; and a temperature adjustment mechanism provided in the shower head;

acquiring a combination of a parameter related to generation of plasma of a processing gas ejected from the shower head and pressure in the space in the base;

estimating temperature of the ceiling plate corresponding to the acquired combination of the parameter and the pressure in the space in the base with reference to temperature information indicating the temperature of the ceiling plate with respect to the combination of the parameter and the pressure in the space in the base; and controlling the temperature adjustment mechanism such that the estimated temperature of the ceiling plate becomes target temperature when a plasma processing is performed on the substrate.

* * * * *